(12) United States Patent
Akita et al.

(10) Patent No.: US 6,452,833 B2
(45) Date of Patent: Sep. 17, 2002

(54) SEMICONDUCTOR MEMORY DEVICE

(75) Inventors: Hironobu Akita, Yokohama; Kenji Tsuchida, Kawasaki; Fumihiro Kohno, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/773,606

(22) Filed: Feb. 2, 2001

(30) Foreign Application Priority Data

Feb. 7, 2000 (JP) .................................... 2000-029273

(51) Int. Cl.$^7$ .............................................. G11C 11/24
(52) U.S. Cl. .................... 365/149; 365/203; 365/230.06
(58) Field of Search ................................. 365/149, 203, 365/230.06, 230.08, 189.09, 208

(56) References Cited

U.S. PATENT DOCUMENTS 5,377,152 A * 12/1994 Kushiyama et al. ......... 365/210
RE37,184 E * 5/2001 Kushiyama et al. ......... 365/201

OTHER PUBLICATIONS

K–C Lee, et al., "Low Voltage High Speed Circiut Designs for Giga–bit DRAMs", 1996 Symposium on VLSI Circuits Digest of Technical Papers, pp. 104–105.

Shinichiro Shiratake, et al., "A Pseudo Multi–Bank DRAM with Categorized Access Sequence", 1999 Symposium on VLSI Circuits Digest of Technical Papers, pp. 127–130.

Yasuharu Sato, et al., "Fast Cycle RAM (FCRAM); a 20–ns Random Row Access, Pipe–Lined Operating DRAM", 1998 Symposium on VLSI Circuits Digest of Technical Papers, pp. 22–25.

* cited by examiner

Primary Examiner—David Nelms
Assistant Examiner—Gene N. Auduong
(74) Attorney, Agent, or Firm—Banner & Witcoff, Ltd.

(57) ABSTRACT

A BL kicker circuit includes first capacitors each of which is connected at one end to a first bit line which is one of bit lines of a corresponding pair and commonly connected at the other end, second capacitors each of which is connected at one end to a second bit line which is the other one of the bit lines of a corresponding pair and commonly connected at the other end, a first driver circuit having an output node for a first signal connected to the common connection node of the other ends of the first capacitors, a second drive circuit having an output node for a second signal connected to the common connection node of the other ends of the second capacitors, and a switch circuit used as an equalizing circuit connected between the output node for the first signal and the output node for the second signal.

30 Claims, 9 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2000-029273, filed Feb. 7, 2000, the entire contents of which are incorporated herein by reference.

BACKGROUND OF THE INVENTION

This invention relates to a dynamic semiconductor memory device for which a measure for improving the retention characteristic of data stored in a memory cell is taken.

In a semiconductor memory device, for example, dynamic random access memory (DRAM), it is required to lower the operation voltage of a memory cell array to keep the reliability high as the size of elements is reduced. If the operation voltage is lowered, the restore potential used for re-writing data into the memory cell is lowered in many cases. Further, if the operation voltage of the memory cell array is lowered, the operation speed of a sense amplifier is lowered which inhibits high-speed operation of the memory device.

If the operation voltage of the memory cell array is lowered, an amount of charges of a signal written into the memory cell is also reduced. Then, a junction leak current flows, and particularly, the retention characteristic of the memory cell which stores "1" data (which is hereinafter referred to as the "1" retention characteristic) is deteriorated. As means for improving the "1" retention characteristic, a Charge Amplifying Boosted Sensing (CABS) Scheme, described in FIG. 1 of an article by K-C Lee et al., entitled "Low Voltage High Speed Circuit Designs for Giga-bit DRAMs," 1996 Symposium on VLSI Circuits Digest of Technical Papers, pp. 104–105, is known.

In the CABS Scheme, a pair of dummy capacitors are respectively connected at one end to paired bit lines, and commonly connected at the other ends. At the time of access to the memory cell, the "1" data readout margin is enlarged by raising the potential on the other ends of the paired dummy capacitors.

That is, if the word line potential is raised at the time of access to the memory cell, the signal charge of the cell capacitor in the memory cell is read out to one of the bit lines. As a result, a potential difference occurs between one bit line and the other bit line. Then, the potential of the other ends of a pair of dummy capacitors is changed from the low level to the high level. Thus, the potentials of the pair of bit lines are raised via the pair of dummy capacitors. After this, the potential difference between the paired bit lines is amplified by operating the sense amplifier and data is sensed.

At this time, if it is desired to further raise the potentials of the bit lines by use of the dummy capacitors, it is necessary to increase the capacitance of the dummy capacitor or increase the amplitude of the potential of the other end of the dummy capacitor. However, in order to increase the capacitance of the dummy capacitor, it is necessary to increase the element area of the capacitor, thereby lowering the integration density of the memory cell since the occupying area of the capacitors on the chip becomes larger. Further, since a parasitic capacitor associated with a node of the other end of the dummy capacitor increases, there occurs a problem that the consumption current caused by the charging and discharging operation increases.

Increasing the amplitude of the potential of the other end of the dummy capacitor may be achieved using the potential amplitude between a boosted power supply potential and the ground potential, the potential amplitude between a power supply potential in the chip and a negative potential, or the potential amplitude between a boosted power supply potential and a negative potential instead of the potential amplitude between the power supply potential in the chip and the ground potential. However, since the boosted power supply potential and the negative potential are created by use of a charge pump circuit in the chip, current consumption of the chip increases by an amount consumed in the charge pump circuit.

In the example explained above, an attempt is made to improve the "1" retention characteristic by raising the potentials of both of the paired bit lines using the CABS Scheme. However, in a case where the other ends of the paired dummy capacitors are separated from each other, potentials can be independently supplied thereto and only the potential of the bit line to which data is read out is raised, the same problem as described above occurs.

Further, a coupling capacitor between the bit line and the word line in the memory cell array becomes large depending on the manufacturing process in some cases. In such a case, the bit line potential will be raised owing to the coupling between the bit line and the word line at the "0" data readout time and a problem that the readout margin is lowered occurs in some cases.

In order to cope with the above drawback, a dummy word line technique is provided for enhancing the "0" readout margin by changing a signal on the other end of the dummy capacitor connected to the bit line to which "0" data is read out from the high level to the low level or changing a signal on the other end of the dummy capacitor connected to the bit line which makes a pair with the bit line to which "0" data is read out from the low level to the high level. Like the CABS Scheme, in the dummy word line technique, there occurs a problem that the consumption current-increases due to the charging and discharging currents at the node of the other end of the dummy capacitor when attempting to attain a significant effect or achieve high-speed row access.

In the DRAM field, a DRAM capable of effecting the high-speed readout operation by making row access at high speed is described in, for example, an article by Yasuhara Sato et al., entitled "Fast Cycle RAM (FCRAM); a 20-ns Random Row Access, Pipe-Lined Operation DRAM," 1998 Symposium on VLSI Circuit Digest of Technical Papers, pp. 22–25, and an article by Shinichiro Shiratake et al., entitled "A Pseudo Multi-Bank DRAM with Categorized Access Sequence," 1999 Symposium on VLSI Circuit Digest of Technical Papers, pp. 127–130.

If the above CABS Scheme is applied to the DRAMs described in those two documents, there occurs a problem that the current consumed in a CABS Scheme circuit is further increased since the CABS Scheme circuit is always operated when the word line is driven.

Thus, in the conventional semiconductor memory device using the CABS Scheme, there occurs a problem that the consumption current is increased if an attempt is made to attain a significant effect by use of the CABS Scheme.

BRIEF SUMMARY OF THE INVENTION

Accordingly an object of this invention is to provide a semiconductor memory device in which the data retention characteristic of a memory cell can be improved without greatly increasing the consumption current.

According to this invention, there is provided a semiconductor memory device comprising plural pairs of bit lines; a memory cell array having a plurality of memory cells connected to the bit lines of plural pairs; a plurality of first capacitors each having one end and the other end, the one end being connected to one of the bit lines of a corresponding pair among the plural pairs of bit lines and the other end being commonly connected to a first node; a plurality of second capacitors each having one end and the other end, the one end being connected to the other one of the bit lines of a corresponding pair among the plural pairs of bit lines and the other end being commonly connected to a second node; a first driver circuit having an output node connected to the first node, for driving the plurality of first capacitors; a second driver circuit having an output node connected to the second node, for driving the plurality of second capacitors; and an equalizing circuit connected between the first and second nodes, for equalizing potentials of the first and second nodes.

According to this invention, there is provided a semiconductor memory device comprising plural pairs of bit lines; first and second memory cell arrays having a plurality of memory cells connected to the bit lines of plural pairs; a plurality of first capacitors each having one end and the other end, the one end being connected to one of the bit lines of a corresponding pair among the plural pairs of bit lines in the first memory cell array and the other end being commonly connected to a first node; a plurality of second capacitors each having one end and the other end, the one end being connected to the other one of the bit lines of a corresponding pair among the plural pairs of bit lines in the first memory cell array and the other end being commonly connected to a second node; a first driver circuit having an output node connected to the first node, for driving the plurality of first capacitors; a second driver circuit having an output node connected to the second node, for driving the plurality of second capacitors; a plurality of third capacitors each having one end and the other end, the one end being connected to one of the bit lines of a corresponding pair among the plural pairs of bit lines in the second memory cell array and the other end being commonly connected to a third node; a plurality of fourth capacitors each having one end and the other end, the one end being connected to the other one of the bit lines of a corresponding pair among the plural pairs of bit lines in the second memory cell array and the other end being commonly connected to a fourth node; a third driver circuit having an output node connected to the third node, for driving the plurality of third capacitors; a fourth driver circuit having an output node connected to the fourth node, for driving the plurality of fourth capacitors; a first equalizing circuit connected between the first and fourth nodes, for equalizing potentials of the first and fourth nodes; and a second equalizing circuit connected between the second and third nodes, for equalizing potentials of the second and third nodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
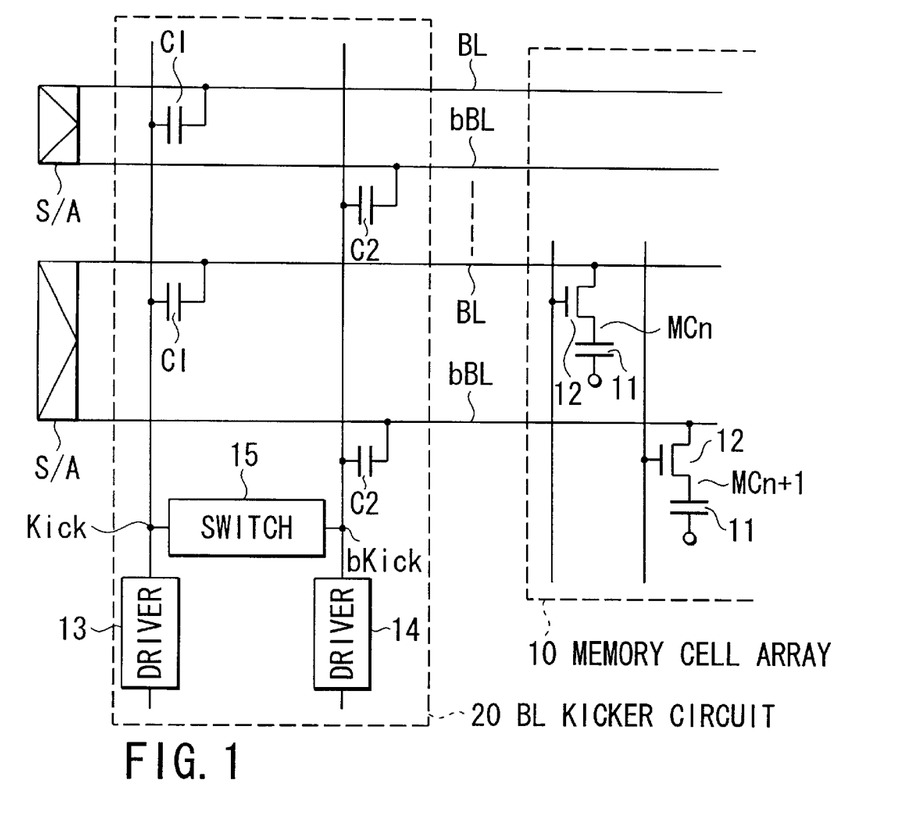
FIG. 1 is a circuit diagram showing the construction of a DRAM according to a first embodiment of this invention.

FIG. 1 is a circuit diagram showing the construction of a DRAM according to a first embodiment of this invention. In a memory cell array 10, plural pairs of bit lines BL, bBL are provided. A plurality of memory cells (in FIG. 1, only one memory cell MCn, MCn+1 is shown) are connected to each of the paired bit lines BL, bBL. Each of the memory cells MCn, MCn+1 is constructed by a cell capacitor 11 for data storage and a transfer transistor 12. The gate of each of the transfer transistors 12 is connected to a corresponding word line (only WLn, WLn+1 are shown in FIG. 1). Further, the plural pairs of bit lines BL, bBL are respectively connected to sense amplifiers S/A each for amplifying and latching a signal read out from a memory cell. Although not shown in the drawing, precharge circuits for precharging the bit lines to a preset potential before reading out data are connected to the paired bit lines BL, bBL.

A BL kicker circuit 20 is provided in the DRAM of this embodiment. The BL kicker circuit 20 includes capacitors C1 each of which is connected at one end to the bit line BL which is one of the bit lines of a corresponding pair and commonly connected at the other end to a node of a signal Kick, capacitors C2 each of which is connected at one end to the bit line bBL which is the other one of the bit lines of a corresponding pair and commonly connected at the other end to a node of a signal bKick, a driver circuit 13 whose output node is connected to the node of the signal Kick, a driver circuit 14 whose output node is connected to the node of the signal bKick, and a switch circuit 15 connected between the node of the signal Kick and the node of the signal bKick and acting as an equalizing circuit.

The switch circuit 15 short-circuits the node of the signal Kick and the node of the signal bKick before the memory cell is accessed. As a result, the potentials of the signals Kick and bKick are made equal to each other.

In this example, assume that the high-level potential of the potential amplitude of output signals of the driver circuits 13, 14 is a boosted potential Vpp and the low-level potential is the ground potential Vss.

Figure 2:
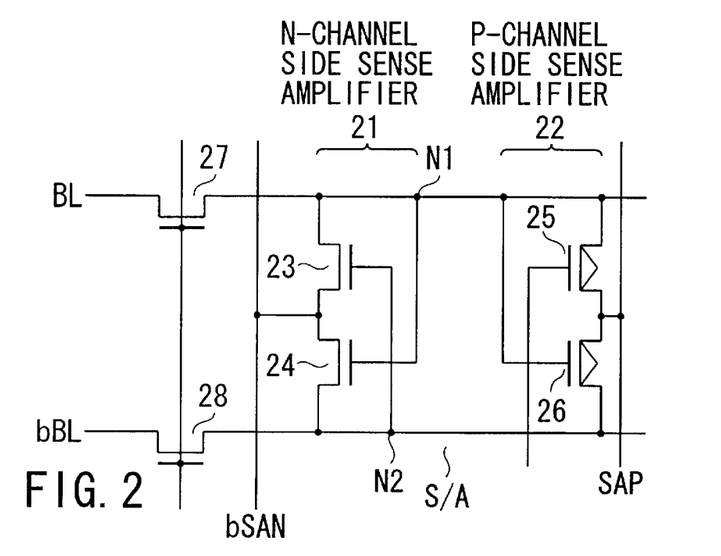
FIG. 2 is a circuit diagram showing the concrete construction of a sense amplifier shown in FIG. 1.

As shown in FIG. 2, the sense amplifier S/A includes an N-channel side sense amplifier 21 and P-channel side sense amplifier 22.

The N-channel side sense amplifier 21 includes an N-channel MOS transistor 23 having a current path between the source and drain connected between a node N1 to which the potential of the bit line BL is transmitted and a node of a control signal bSAN for activating the sense amplifier and a gate connected to a node N2 to which the potential of the bit line bBL is transmitted and an N-channel MOS transistor 24 having a current path between the source and drain connected between the node N2 and the node of the control signal bSAN and a gate connected to the node N1.

The P-channel side sense amplifier 22 includes a P-channel MOS transistor 25 having a current path between the source and drain connected between the node N1 and a node of a control signal SAP for activating the sense amplifier and a gate connected to the node N2 and a P-channel MOS transistor 26 having a current path between the source and drain connected between the node N2 and the node of the control signal SAP and a gate connected to the node N1.

In FIG. 2, two N-channel MOS transistors 27, 28 in which one-side ends of the current paths between the sources and drains are respectively connected to the bit lines BL and bBL are bit line selection transistors for permitting the pair of bit lines BL, bBL arranged on both sides of the sense amplifier S/A to commonly use the sense amplifier S/A.

In the sense amplifier S/A shown in FIG. 2, the N-channel side sense amplifier 21 is activated by lowering the sense amplifier activating control signal bSAN to the low level and the P-channel side sense amplifier 22 is activated by raising the control signal SAP to the high level. In general, the control operation is effected to change one of the control signals bSAN and SAP before changing the other control signal so as to start the operation of a corresponding one of the sense amplifiers earlier than the other sense amplifier and then start the operation of the other sense amplifier.

Figure 3:
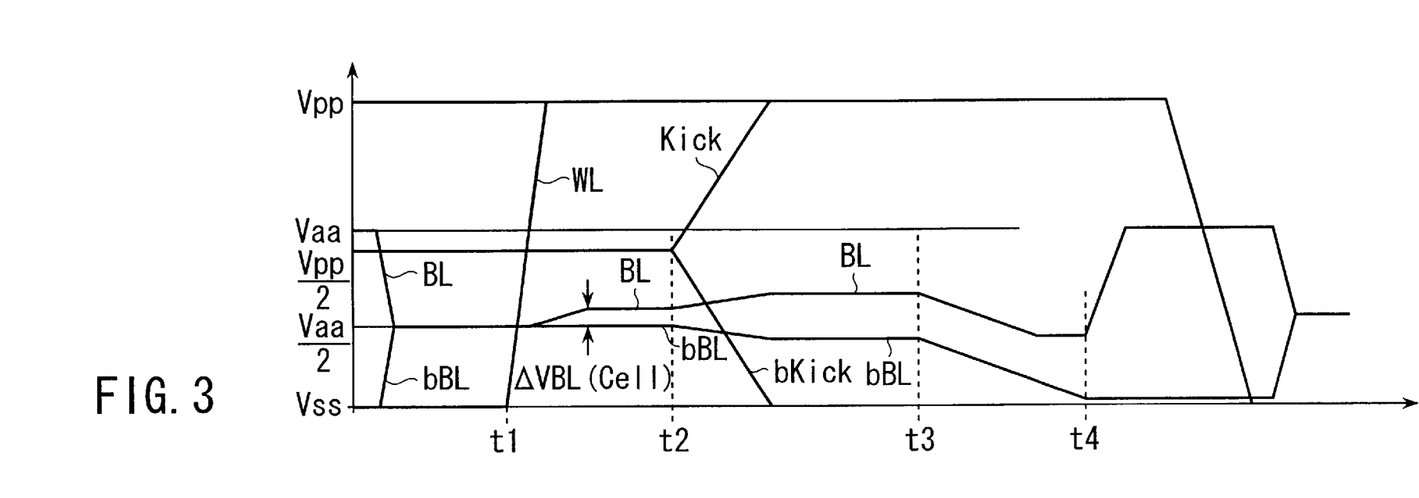
FIG. 3 is a waveform diagram showing one example of the operation of a DRAM shown in FIG. 1.

Next, the operation effected when the memory cell MCn is accessed is explained with reference to the waveform diagrams of FIGS. 3 and 4. FIG. 3 shows a case wherein the N-channel side sense amplifier 21 of the sense amplifier S/A is operated before the P-channel side sense amplifier 22 and FIG. 4 shows a case wherein the P-channel side sense amplifier 22 is operated before the N-channel side sense amplifier 21.

Figure 4:
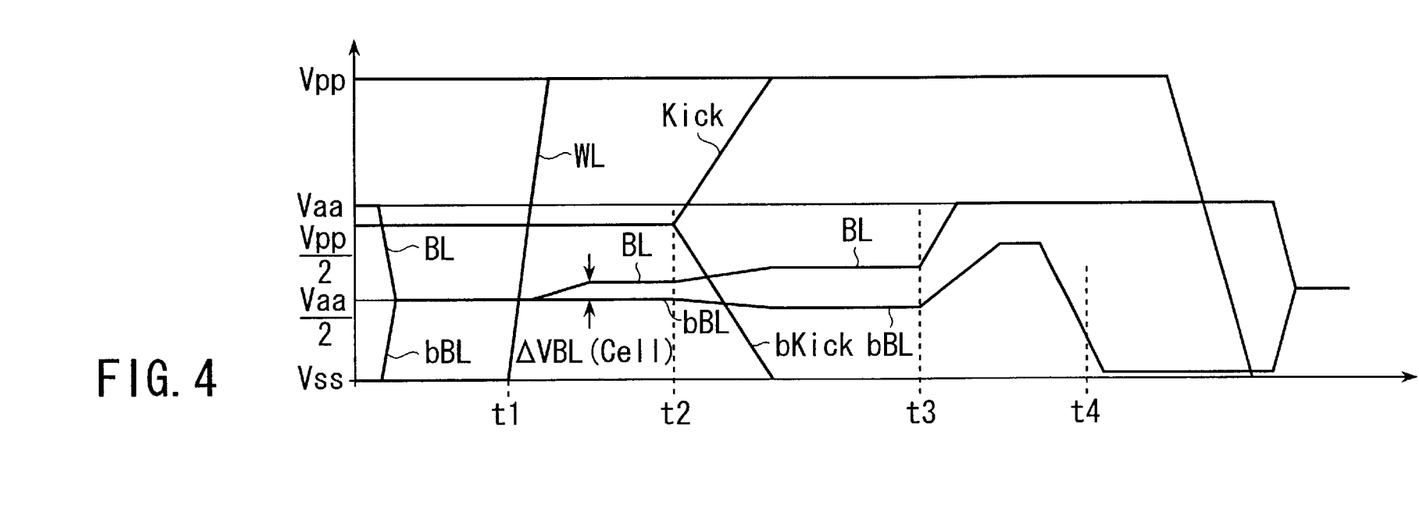
FIG. 4 is a waveform diagram showing another example of the operation of a DRAM shown in FIG. 1.

A potential Vaa in FIGS. 3 and 4 is a high-level side potential of the potential amplitude of the bit line BL, a potential Vss is a low-level side potential thereof and generally set at the ground potential of 0V.

Before accessing the memory cell MCn, the bit lines BL, bBL are previously precharged to a potential Vaa/2 which is an intermediate potential of the bit line potential amplitude by use of a bit line precharge circuit (not shown). Then, the potential of the word line WLn is raised to a high level (for example, potential Vpp) to select the memory cell MCn.

Assume now that one of the signals Kick and bKick is set to the potential Vpp and the other signal is set to the potential Vss after the preceding access was terminated. Then, the switch circuit 15 is kept conductive for a preset period of time before raising the potential of the word line WLn. As a result, the node of the signal Kick and the node of the signal bKick are short-circuited so as to equalize the potentials of the signals Kick and bKick to Vpp/2 {=(Vpp-Vss)/2}.

When the potential of the word line WLn is raised (t1), the transfer transistor 12 in the memory cell MCn is turned ON to read out the signal charge of the cell capacitor 11 to the bit line BL. As a result, a potential difference $\Delta$VBL(Cell) occurs between the bit line BL and the other bit line bBL.

Next, the signal Kick is changed from the potential Vpp/2 to the high level (potential Vpp) and the signal bKick is changed from the potential Vpp/2 to the low level (potential Vss) (t2).

When the signal Kick is raised to the high level, the potential of the bit line BL is raised via the capacitor C1 and when the signal bKick is lowered to the low level, the potential of the bit line bBL is lowered via the capacitor C2. As a result, the potential difference between the bit lines BL and bBL is further increased. After this, the potential difference between the bit lines BL and bBL is amplified by operating the sense amplifier S/A to sense data.

If the N-channel side sense amplifier 21 of the sense amplifier S/A is operated before the P-channel side sense amplifier 22, as shown in FIG. 3, the potential difference between the bit lines BL and bBL is changed to increase while the potentials of the bit lines BL, bBL are both being lowered after the N-channel side sense amplifier 21 is operated (t3). The potential difference between the bit lines is changed to further increase while the potential of the bit line BL is being raised after the operation of the P-channel side sense amplifier 22 is started (t4).

The BL kicker circuit 20 is controlled so that the sum of the potential differences that occur at the bit lines BL and bBL from time t2 to time t3 may be smaller than the potential difference that occurs at time t2 between the bit lines BL and bBL.

It is better in some cases to first operate the P-channel side sense amplifier 22 depending on the setting condition of the power supply potentials. FIG. 4 shows a waveform obtained when the P-channel side sense amplifier 22 is operated before the N-channel side sense amplifier 21. The potential difference between the bit lines is changed to increase while the potentials of the bit lines BL, bBL are both being raised after the P-channel side sense amplifier 22 is operated (t3). The potential difference between the bit lines is changed to increase while the potential of the bit line bBL is being lowered after the operation of the N-channel side sense amplifier 21 is started (t4).

In this case, the potential amplitude (Vpp/2) of the signal Kick used for raising the potential of the bit line BL to which the memory cell MCn to be accessed is connected is equal to half of the potential Vpp used in the prior art. Therefore, the amount of the current flowing from the Vpp power supply when the node of the signal Kick is charged by use of the boosted potential Vpp can be suppressed to half of the amount of the conventional case, and therefore, a significant increase in the consumption current by providing the BL kicker circuit can be prevented.

Since the amplitude of the potential of the signal Kick is set to half of the potential Vpp used in the prior art, a rising amount of the potential of the bit line BL is reduced in comparison with the conventional case accordingly. However, since the signal bKick is lowered to the low level and the potential of the bit line bBL is lowered via the capacitor C2, the potential difference occurring between the bit lines BL and bBL after the memory cell is selected by raising the potential of the word line can be acquired with substantially the same level as in the conventional case.

Figure 5:
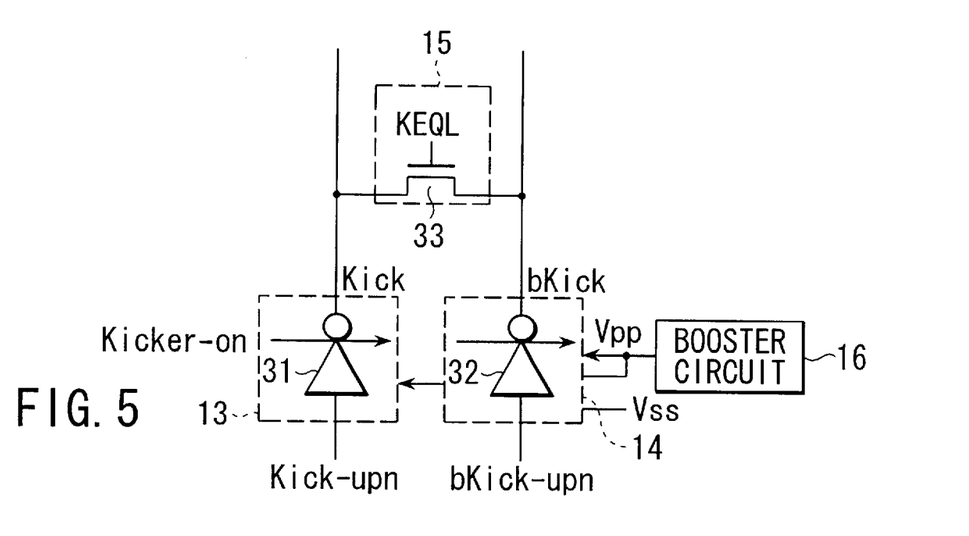
FIG. 5 is a circuit diagram showing the concrete construction of a circuit including a driver circuit and switch circuit shown in FIG. 1.

FIG. 5 shows the concrete construction of a circuit including the driver circuits 13, 14 and switch circuit 15 shown in FIG. 1.

The driver circuits 13, 14 respectively include clocked inverter circuits 31, 32 of tri-state type (three output states) whose output state is selectively set to one of a high-level state, low-level state and high-impedance state. The operations of the clocked inverter circuits 31, 32 are controlled in synchronism with a clock signal Kicker-on and an inverted signal bKicker-on thereof (in FIG. 5, only the signal Kicker-on is shown). A signal Kick-upn is input to the clocked inverter circuit 31 and a signal bKick-upn is input to the clocked inverter circuit 32. A boosted potential Vpp created in a booster circuit 16 having a charge pump circuit for boosting an external power supply potential Vcc is supplied to the clocked inverter circuits 31, 32 as a high-potential side power supply potential and the ground potential Vss of 0V is supplied thereto as a low-potential side potential.

The switch circuit 15 includes an N-channel MOS transistor 33 having a gate supplied with a control signal KEQL and a current path between the source and drain connected between a node of the signal Kick and a node of the signal bKick.

Figure 6:
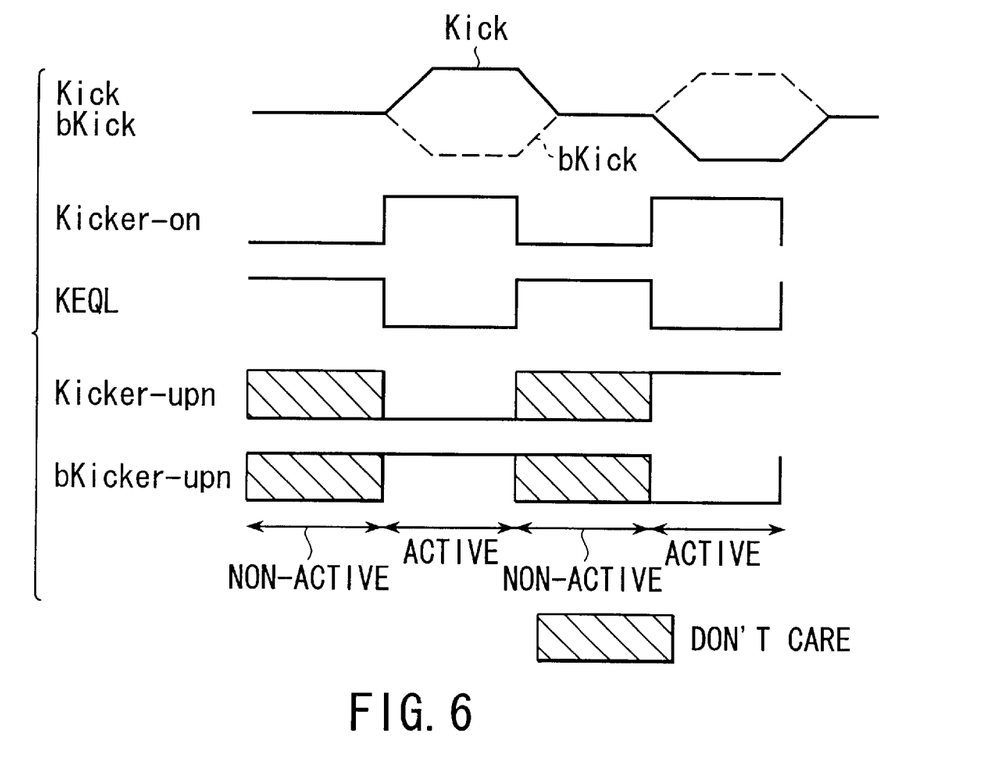
FIG. 6 is a waveform diagram showing one example of the operation of a circuit shown in FIG. 5.

Next, the operation of the circuit of FIG. 5 is explained with reference to the waveform diagram of FIG. 6. In a non-active period, the clock signal Kicker-on is set at the low level (the inverted signal bKicker-on is set at the high level). At this time, the clocked inverter circuits 31, 32 are not operated and the output states thereof are set in the high-impedance state. At this time, the input signals Kick-upn and bKick-upn of the clocked inverter circuits 31, 32 can be set at any level (don't care).

In the non-active period, the control signal KEQL is set at the high level. Therefore, the MOS transistor 33 is turned ON, the nodes of the signals Kick and bKick are short-circuited to equalize the signals Kick and bKick to the same potential Vpp/2.

In a next active period, the clock signal Kicker on is set at the high level (the inverted signal bKicker-on is set at the low level). At this time, both of the clocked inverter circuits 31, 32 are set into an operable state. At this time, if a low level is input as the input signal Kick-upn of the clocked inverter circuit 31 and a high level is input as the input signal bKick-upn of the clocked inverter circuit 32, then a signal of the high level (potential Vpp) is output from the clocked inverter circuit 31 and a signal of the low level (potential Vss) is output from the clocked inverter circuit 32.

In the active period, the control signal KEQL is set at the low level. At this time, the MOS transistor 33 is turned OFF so that the output node of the clocked inverter circuit 31 can be charged by the potential Vpp and the signal Kick will be changed from the potential Vpp/2 to the potential Vpp.

On the other hand, the output node of the clocked inverter circuit 32 is discharged to the potential Vss and the signal bKick is changed from the potential Vpp/2 to the potential Vss.

In the active period after the next non-active period, the input signal Kick-upn of high level is input to the clocked inverter circuit 31 and the input signal bKick-upn of low level is input to the clocked inverter circuit 32. At this time, a signal of low level is output from the clocked inverter circuit 31 and a signal of high level is output from the clocked inverter circuit 32, and unlike the former active period, the signal bKick is changed from the potential Vpp/2 to the potential Vpp and the signal Kick is changed from the potential Vpp/2 to the potential Vss.

In the initial portion of the non-active period after the end of each active period, the MOS transistor 33 is turned ON by the control signal KEQL. When the MOS transistor 33 is turned ON, the signal Kick which is set at one of the potentials Vpp and Vss and the signal bKick which is set at the other potential are both converged towards the intermediate potential Vpp/2.

In the first embodiment, the boosted potential Vpp created in the booster circuit 16 is supplied to the clocked inverter circuits 31, 32 as the high-potential side power supply potential and the ground potential Vss of 0V is supplied as the low-potential side potential so as to make the potential amplitudes of the signals Kick, bKick larger than the potential amplitude between Vcc and Vss.

Figure 7:
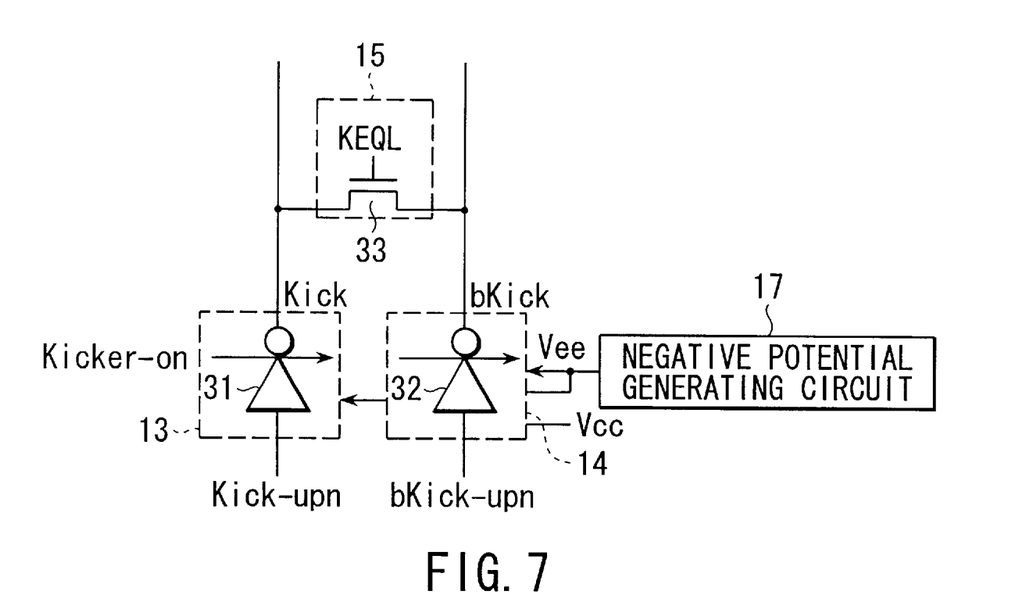
FIG. 7 is a circuit diagram showing the concrete construction of a circuit including a driver circuit and switch circuit according to a second embodiment of this invention.

Next, a second embodiment is explained with reference to FIG. 7. FIG. 7 shows the concrete construction of a circuit including the driver circuits 13, 14 and switch circuit 15 shown in FIG. 1.

In this embodiment, the potential amplitudes of signals Kick, bKick are made equal to the potential amplitude between Vcc and Vee which is larger than the potential amplitude between Vcc and Vss by supplying a normal power supply potential Vcc to clocked inverter circuits 31, 32 as a high-potential side power supply potential and supplying a negative potential Vee which is created in a negative potential generating circuit 17 including a charge pump circuit and is lower than the ground potential Vss as a low-potential side potential.

In FIGS. 5 and 7, as the switch circuit 15, a P-channel MOS transistor or a combination of N- and P-channel MOS transistors can be used other than the N-channel MOS transistor.

Next, a third embodiment of this invention is explained.

Figure 8:
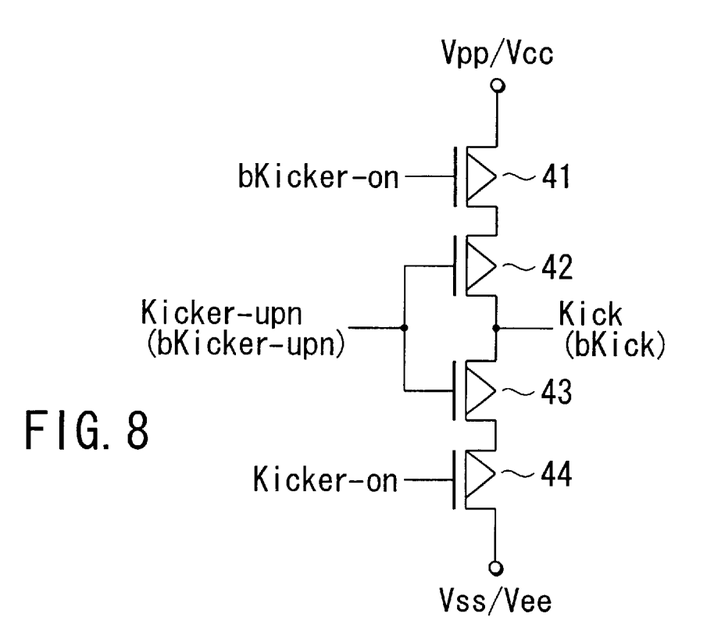
FIG. 8 is a circuit diagram showing the concrete construction of a clocked inverter circuit used as the driver circuit in the first and second embodiments.

In the first and second embodiments, as shown in FIG. 8, each of the clocked inverter circuits 31, 32 used as the driver circuits 13, 14 includes two P-channel MOS transistors 41, 42 and two N-channel MOS transistors 43, 44. The current paths between the sources and drains of the two P-channel MOS transistors 41, 42 are serially connected between a node of the potential Vpp or Vcc and a node of a signal Kick or bKick and the current paths between the sources and drains of the two N-channel MOS transistors 43, 44 are serially connected between a node of the potential Vss or Vee and the node of the signal Kick or bKick.

With the above construction, there occurs a possibility in some cases that the resistance between the power supply nodes becomes high, the current driving ability of the signal Kick or bKick for the output node becomes low and a problem occurs in the operation.

Therefore, in the third embodiment, an attempt is made to prevent the current driving ability of the driver circuits 13, 14 in the first and second embodiments from being lowered.

Figure 9:
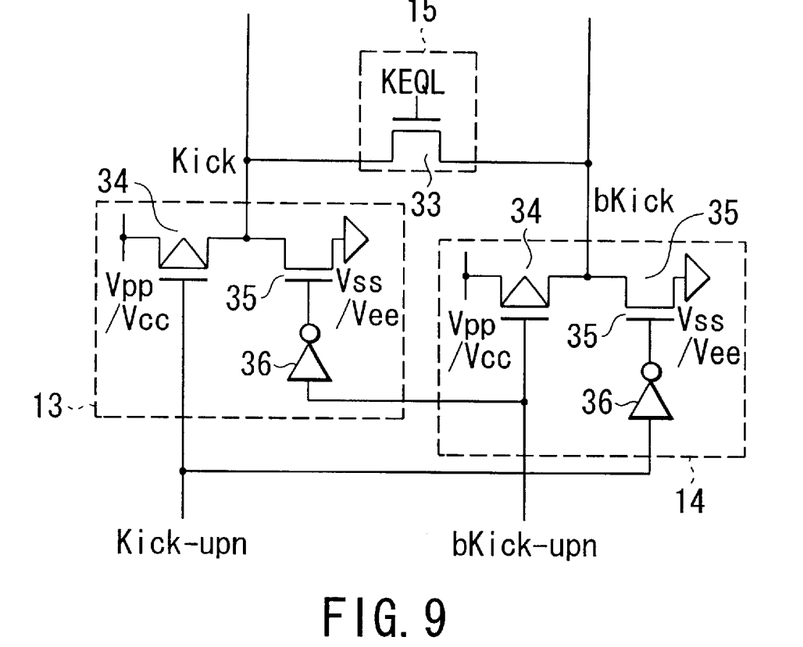
FIG. 9 is a circuit diagram showing the concrete construction of a circuit including a driver circuit and switch circuit according to a third embodiment of this invention.

FIG. 9 shows the third embodiment of this invention and shows the concrete construction of the driver circuits 13, 14 and switch circuit 15 shown in FIG. 1.

In the third embodiment, like the case of FIGS. 5 and 7, the switch circuit 15 includes an N-channel MOS transistor 33.

Unlike the case of FIGS. 5 and 7, each of the driver circuits 13, 14 includes a P-channel MOS transistor 34, N-channel MOS transistor 35 and inverter circuit 36.

In the driver circuit 13, the current paths between the sources and drains of the P-channel MOS transistor 34 and N-channel MOS transistor 35 are serially connected between a supply node of the high-potential side power supply potential Vpp/Vcc and a supply node of the low-potential side potential Vss/Vee. An input signal Kick-upn is supplied to the gate of the MOS transistor 34 and an input signal bKick-upn is supplied to the gate of the MOS transistor 35 via the inverter circuit 36.

In the driver circuit 14, the current paths between the sources and drains of the P-channel MOS transistor 34 and N-channel MOS transistor 35 are serially connected between the supply node of the high-potential side power supply potential Vpp/Vcc and the supply node of the low-potential side potential Vss/Vee. The input signal bKick-upn is supplied to the gate of the MOS transistor 34 and the input signal Kick upn is supplied to the gate of the MOS transistor 35 via the inverter circuit 36.

Figure 10:
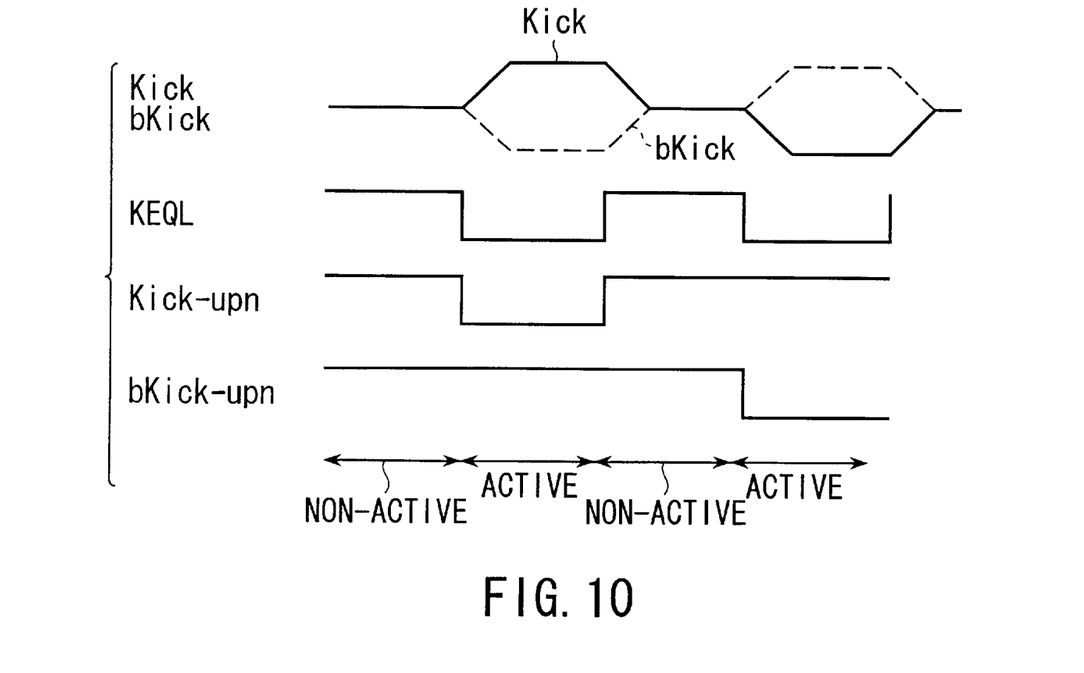
FIG. 10 is a waveform diagram showing one example of the operation of the circuit shown in FIG. 9.

Next, the operation of the circuit of FIG. 9 is explained with reference to the waveform diagram of FIG. 10. In the following description, it is assumed that Vpp is supplied as the high-potential side power supply potential and Vss is supplied as the low potential to the driver circuits 13, 14.

In the non-active period, the input signals Kick-upn and bKick-upn are both set at the high level. At this time, since the output signal of the inverter circuit 36 of each of the driver circuits 13, 14 is set at the low level, the P-channel MOS transistor 34 and N-channel MOS transistor 35 are both set in the OFF state and the output states of the driver circuits 13, 14 are set into the high-impedance state.

In the non-active period, the control signal KEQL is set at the high level. Therefore, the MOS transistor 33 in the switch circuit 15 is set in the ON state and the node of the signal Kick and the node of the signal bKick are short-circuited so as to set the signals Kick and bKick to the same potential Vpp/2.

In the next active period, the input signal Kick-upn is changed to the low level and the input signal bKick-upn is not changed and kept at the high level. When the input signal Kick-upn is changed to the low level, the P-channel MOS transistor 34 of the driver circuit 13 is turned ON and a signal of high level (potential Vpp) is output from the driver circuit 13. Further, when the input signal Kick-upn is changed to the low level, the output signal of the driver circuit 14 is inverted to the high level so as to turn ON the N-channel MOS transistor 35 and a signal of low level (potential Vss) is output from the driver circuit 14.

In the above active period, since the control signal KEQL is set at the low level, the MOS transistor 33 in the switch circuit 15 is set in the OFF state, the output node of the driver circuit 13 is charged by the potential Vpp and the signal Kick is changed from the potential Vpp/2 to the potential Vpp. On the other hand, the output node of the driver circuit 14 is discharged to the potential Vss and the signal bKick is changed from the potential Vpp/2 to the potential Vss.

Then, in the active period after the next nonactive period, the input signal Kick-upn is changed to the high level and the input signal bKick-upn is changed to the low level. When the input signals Kick-upn and bKick-upn are respectively set to the high level and low level, the P-channel MOS transistor 34 of the driver circuit 13 is turned OFF, the N-channel MOS transistor 35 thereof is turned ON and a signal of low level (potential Vss) is output from the driver circuit 13. In the driver circuit 14, the P-channel MOS transistor 34 is turned ON, the N-channel MOS transistor 35 is turned OFF and a signal of high level (potential Vpp) is output from the driver circuit 14.

As a result, unlike the former active period, the signal bKick is changed from the potential Vpp/2 to the potential Vpp and the signal Kick is changed from the potential Vpp/2 to the potential Vss.

In the case of the second embodiment in which Vcc is supplied as the high-potential side power supply potential and Vee is supplied as the low-potential side potential to the driver circuits 13, 14, Vcc, Vee may be used instead of Vpp, Vss and (Vcc-Vee)/2 may be used instead of Vpp/2 in the above explanation.

Thus, the two driver circuits 13, 14 shown in FIG. 9 function as inverter circuits for outputting logically inverted signals with respect to the input signals Kick-upn and bKick-upn.

In the third embodiment, since the amount of the current flowing from the high-potential power supply when the node of the signal Kick is charged by the high potential can be suppressed to half of that of the conventional case, a significant increase in the consumption current by providing the BL kicker circuit can be prevented. In addition, since the current path between the source and drain of only one MOS transistor is connected between each of the nodes of the high and low power supply potentials and a corresponding one of the nodes of the signals Kick and bKick in each of the driver circuits 13, 14, the resistance between each of the nodes of the high and low power supply potentials and a corresponding one of the nodes of the signals Kick and bKick can be reduced and the current driving ability can be enhanced in comparison with the cases of the first and second embodiments.

In the first to third embodiments, it is necessary to use a large number of elements to construct the driver circuits 13, 14. However, since the driver circuits 13, 14 are each provided only one for a large number of columns (a plurality of bit line pairs) in the memory cell array, an increase in the chip area is as small as negligible.

Next, a fourth embodiment of this invention is explained.

In the first to third embodiments, the consumption current can be suppressed to half of that of the conventional case by short-circuiting the nodes of the signals Kick and bKick by use of the MOS transistor 33. However, if the nodes are simply short-circuited by use of the MOS transistor 33, there occurs a possibility that the potential will fluctuate from Vpp/2 or (Vcc-Vee)/2 due to the presence of a leak current at the non-active time. Therefore, in the fourth embodiment, an attempt is made to suppress the fluctuation.

Figure 11:
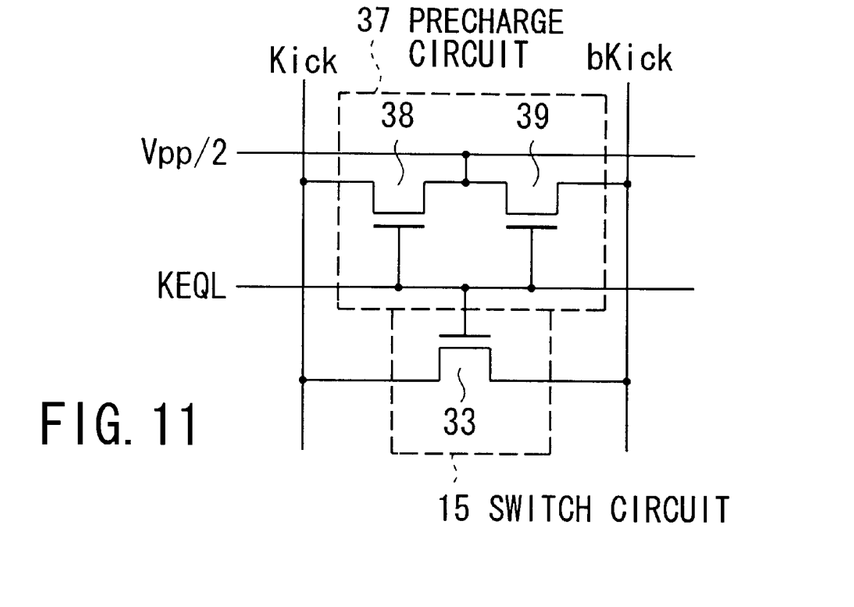
FIG. 11 is a circuit diagram showing the concrete construction of a circuit including a switch circuit and the surrounding portion thereof in a fourth embodiment of this invention.

FIG. 11 shows the fourth embodiment of this invention and shows the concrete construction of the switch circuit 15 and the surrounding portion thereof extracted from the circuit of FIG. 1. The switch circuit 15 includes a MOS transistor 33 used for short-circuiting nodes of signals Kick and bKick in response to a control signal KEQL. In this embodiment, a precharge circuit 37 is further connected to the nodes of the signals Kick and bKick. The precharge circuit 37 includes an N-channel MOS transistor 38 whose current path between the source and drain is connected between the node of the signal Kick and a node to which the potential Vpp/2 is supplied and whose gate is supplied with the control signal KEQL and an N-channel MOS transistor 39 whose current path between the source and drain is connected between the node of the signal bKick and the node to which the potential Vpp/2 is supplied and whose gate is supplied with the control signal KEQL.

With the above construction, the control signal KEQL is set to the high level so as to turn ON the N-channel MOS transistor 33 and short-circuit the nodes of the signals Kick and bKick. When the control signal KEQL is set to the high level, the MOS transistors 38, 39 in the precharge circuit 37 are also turned ON so as to charge the nodes of the signals Kick and bKick from the potential Vpp/2 via the respective MOS transistors 38, 39. Therefore, it is possible to prevent the potentials of the signals Kick and bKick from fluctuating from Vpp/2 due to the leak current or the like in the non-active period.

Assuming now that the value of the boosted potential Vpp is set at 2.4V, for example, the value of Vpp/2 becomes 1.2V which is lower than the normal power supply potential Vcc (for example, 1.6V). Therefore, the potential Vpp/2 can be created by lowering the potential Vcc. That is, when the potential Vpp/2 is created, it is not necessary to use an output of the booster circuit using the charge pump circuit and an increase in the consumption current in the booster circuit can be suppressed.

Further, if the nodes of the signals Kick and bKick are completely short-circuited, the effect of the BL kicker circuit for raising or lowering the potentials of the bit line BL, bBL can be attained even when the potential Vpp/2 slightly fluctuates from the set value. Therefore, since the element size of the MOS transistors 38, 39 constructing the precharge circuit 37 can be made small, an increase in the chip area due to provision of the precharge circuit 37 does not cause any serious problem.

In this embodiment, if Vcc is supplied as the high-potential side potential and Vee is supplied as the low-potential side potential to the driver circuits 13, 14 as in the second embodiment, (Vcc-Vee)/2 may be supplied to the MOS transistors 38, 39 instead of the potential Vpp/2.

Next, the concrete example of the capacitors C1, C2 used in the above embodiments is explained. In the normal DRAM process, a MOS capacitor is used as a capacitor in many cases, and in this example, the MOS capacitor is used. The capacitance of the MOS capacitor is changed before and after formation of the channel.

For example, if the MOS capacitor is formed by short-circuiting the source and drain of an N-channel MOS transistor, no channel is formed when a potential difference of the gate potential with respect to the back-gate potential is lower than the threshold voltage Vthn thereof and the capacitance is smaller than that obtained when the channel is formed.

Figure 12A:
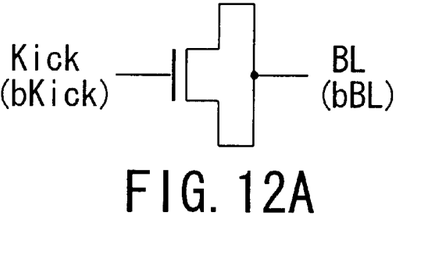
FIGS. 12A and 12B are circuit diagrams showing concrete examples of a capacitor used in each embodiment.

As shown in FIG. 12A, in a case where a capacitor formed by short-circuiting the source and drain of an N-channel MOS transistor, connecting the gate to the node of the signal Kick or bKick and connecting the source and drain to the bit line BL or bBL is used as the capacitor C1 or C2, the precharge potential of the precharge circuit 37 shown in FIG. 11 can be set to an adequate potential, for example, (Vpp/2)+Vthn which is higher than the potential Vpp/2 by the threshold voltage Vthn of the N-channel MOS transistor.

Figure 12B:
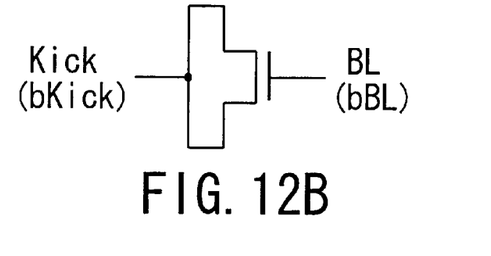

Further, as shown in FIG. 12B, in a case where a capacitor formed by short-circuiting the source and drain of an N-channel MOS transistor, connecting the gate to the bit line BL or bBL and connecting the source and drain to the node of the signal Kick or bKick is used as the capacitor C1 or C2, the precharge potential of the precharge circuit 37 shown in FIG. 11 can be set to an adequate potential, for example, (Vpp/2)−Vthn which is lower than the potential Vpp/2 by the threshold voltage Vthn of the N-channel MOS transistor.

Figure 13A:
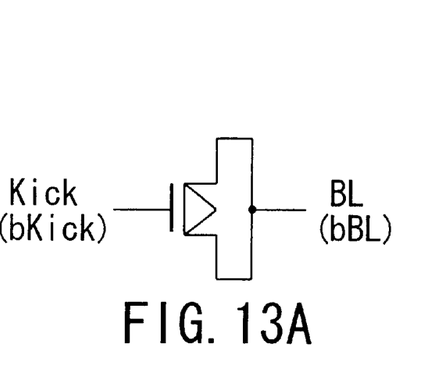
FIGS. 13A and 13B are circuit diagrams showing other concrete examples of a capacitor used in each embodiment.

Further, if the MOS capacitor is formed by short-circuiting the source and drain of a P-channel MOS transistor, no channel is formed when a potential difference of the gate potential with respect to the back-gate potential is higher than the threshold voltage Vthp (negative value) thereof and the capacitance is smaller than that obtained when the channel is formed. Therefore, as shown in FIG. 13A, in a case where a capacitor formed by short-circuiting the source and drain of a P-channel MOS transistor, connecting the gate to the node of the signal Kick or bKick and connecting the source and drain to the bit line BL or bBL is used as the capacitor C1 or C2, the precharge potential of the precharge circuit 37 shown in FIG. 11 can be set to an adequate potential, for example, (Vpp/2)−|Vthp| which is lower than the potential Vpp/2 by the threshold voltage Vthp of the P-channel MOS transistor.

Figure 13B:
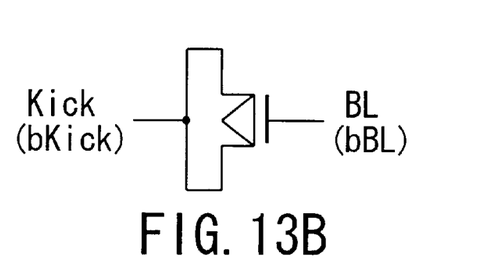

Further, as shown in FIG. 13B, in a case where a capacitor formed by short-circuiting the source and drain of a P-channel MOS transistor, connecting the gate to the bit line BL or bBL and connecting the source and drain to the node of the signal Kick or bKick is used as the capacitor C1 or C2, the precharge potential of the precharge circuit 37 shown in FIG. 11 can be set to an adequate potential, for example, (Vpp/2)+|Vthp| which is higher than the potential Vpp/2 by the threshold voltage Vthp of the P-channel MOS transistor.

In addition, not only the above MOS capacitor but also a capacitor in which a variation in the capacitance with a change of the potential is relatively small, for example, a capacitor having conductive layers disposed on both sides of an insulating material, a depletion MOS transistor, and a capacitor having the same structure as the cell capacitor for data storage used in the memory cell can be used.

If the above capacitor is used as the capacitor C1, C2 and when the amplitude of the potential of the node of the signal Kick, bKick is set in a range of the amplitude between Vpp and Vss, for example, the consumption current can be made small as a whole in some cases by setting the precharge potential of the precharge circuit 37 higher than Vpp/2 from the viewpoint of the boosting efficiency of the booster circuit for creating the boosted potential Vpp. Also, in this case, the precharge potential can be set to an adequate potential.

Likewise, when the amplitude of the potential of the node of the signal Kick, bKick is set in a range of the amplitude between Vcc and a negative potential Vnn, for example, the consumption current can be made small as a whole in some cases by setting the precharge potential of the precharge circuit 37 lower than (Vcc-Vnn)/2 from the viewpoint of the efficiency of a circuit for creating the negative potential Vnn. Also, in this case, the precharge potential can be set to an adequate potential.

Next, a fifth embodiment of this invention is explained.

In the case of FIG. 1, a case wherein the BL kicker circuit is disposed on one side of the sense amplifier S/A is explained, but in an actual DRAM in which a plurality of memory cell arrays are arranged, driver circuits 13, 14 and capacitors C1, C2 of one BL kicker circuit are separately arranged on both sides of the sense amplifier S/A from the viewpoint of the layout in some cases. In this case, it becomes difficult to connect the switch circuit 15.

Figure 14:
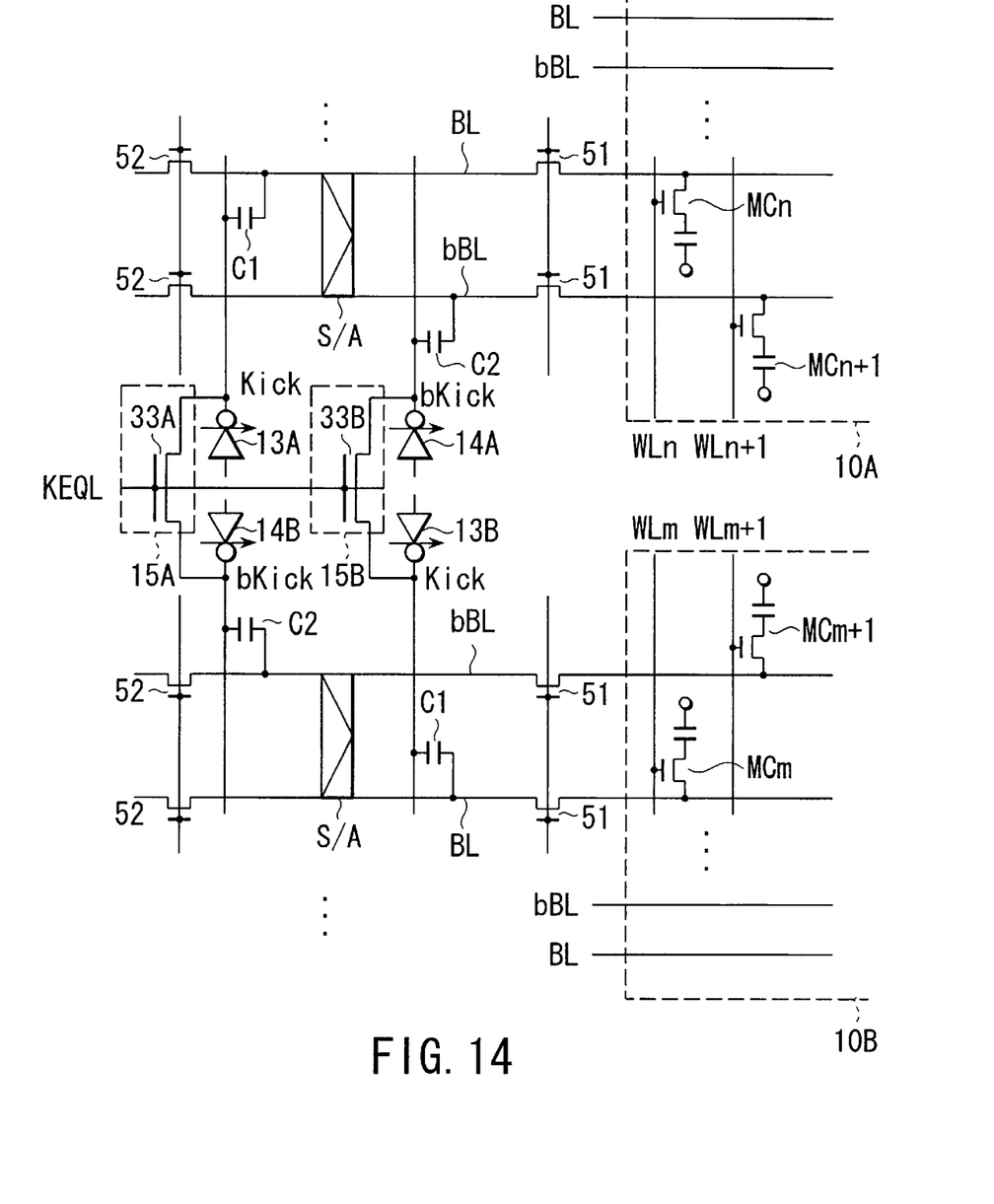
FIG. 14 is a circuit diagram showing a DRAM according to a fifth embodiment of this invention.

Therefore, in the DRAM according to the fifth embodiment of this invention, a BL kicker circuit including two driver circuits 13, 14 (clocked inverters 31, 32), capacitors C1, C2 and switch circuit 15 (N-channel MOS transistor 33) as shown in FIG. 5, for example, is provided for every preset number of memory cell arrays (in FIG. 14, only two memory cell arrays 10A, 10B are shown). In this case, the drivers, capacitors and the like are separately indicated by attaching "A" to the tail of each symbol of the element associated with the memory cell array 10A and attaching "B" to the tail of each symbol of the element associated with the memory cell array 10B.

The switch circuits 15 are connected between the different memory cell arrays. In other words, each of the switch circuits 15 is connected to connect the output nodes of the driver circuits 13 and 14 of the adjacent BL kicker circuits so as to equalize the potentials of the signals Kick and bKick. The switch circuits 15 are separately indicated by attaching "A" to the tail of the symbol of the circuit for the memory cell array 10A and attaching "B" to the tail of the symbol of the circuit for the memory cell array 10B.

Specifically, the current path between the source and drain of a MOS transistor 33A constructing a switch circuit 15A is connected between the node of the signal Kick which is an output node of a driver circuit 13A of the BL kicker circuit provided in the memory cell array 10A and the node of the signal bKick which is an output node of a driver circuit 14B of the BL kicker circuit provided in the memory cell array 10B. Further, the current path between the source and drain of a MOS transistor 33B constructing a switch circuit 15B is connected between the node of the signal Kick which is an output node of a driver circuit 13B of the BL kicker circuit provided in the memory cell array 10B and the node of the signal bKick which is an output node of a driver circuit 14A of the BL kicker circuit provided in the memory cell array 10A.

With the above construction, it is not necessary to connect the switch circuit to extend over the sense amplifier S/A and the layout of the circuits can be easily made.

In FIG. 14, each pair of N-channel MOS transistors 51 whose current paths between the sources and drains are connected between the sense amplifier S/A and corresponding paired bit lines are used to separate the sense amplifier S/A from different bit lines arranged on the right side of the sense amplifier S/A. Likewise, each pair of N-channel MOS transistors 52 whose current paths between the sources and drains are connected between the sense amplifier S/A and corresponding paired bit lines are used to separate the sense amplifier S/A from different bit lines arranged on the left side of the sense amplifier S/A.

Figure 15:
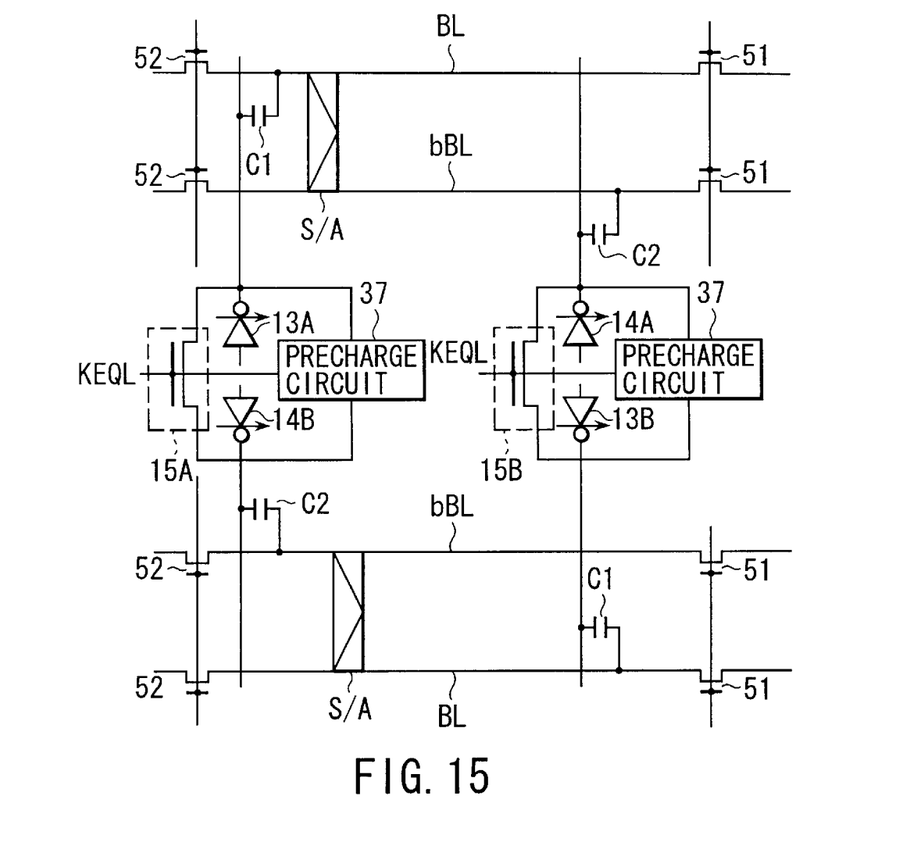
FIG. 15 is a circuit diagram showing a DRAM according to a sixth embodiment of this invention.

In the DRAM of FIG. 14, a case wherein the clocked inverters 31, 32 are used as the driver circuits 13, 14 is explained, but the driver circuit can be constructed by use of two MOS transistors and one inverter as indicated in the embodiment shown in FIG. 9 and, like the sixth embodiment shown in FIG. 15, the precharge circuit of FIG. 11 can be provided.

Figure 16:
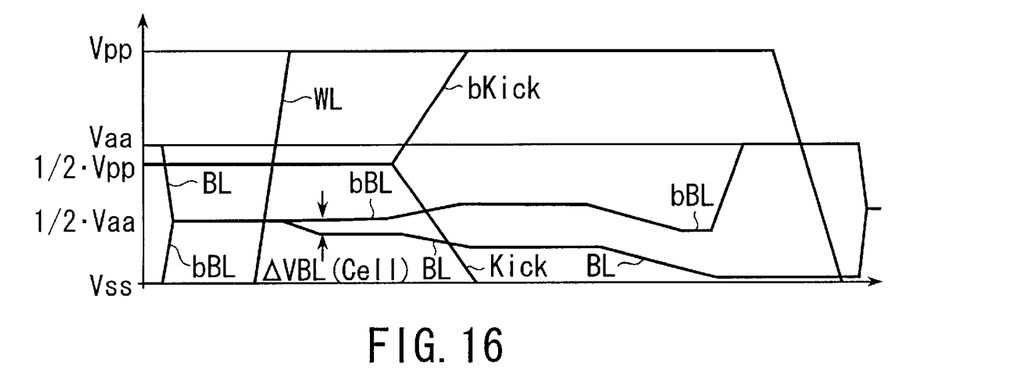
FIG. 16 is a waveform diagram showing one example of the operation of a DRAM according to a seventh embodiment of this invention.
Figure 17:
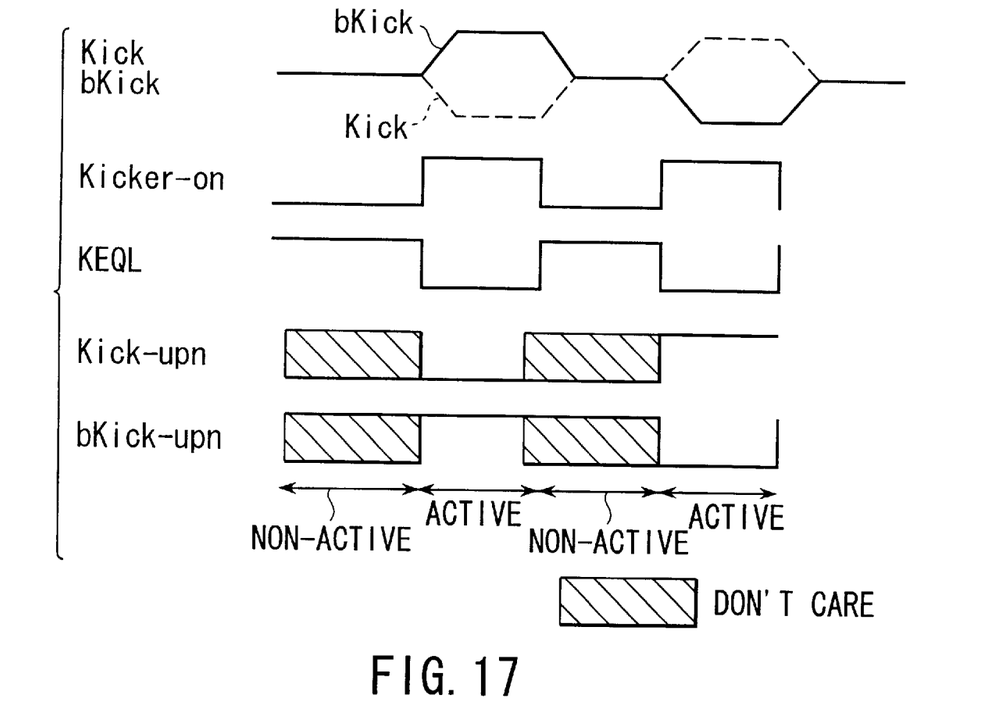
FIG. 17 is a waveform diagram showing one example of a signal used in a DRAM according to this invention.
Figure 18:
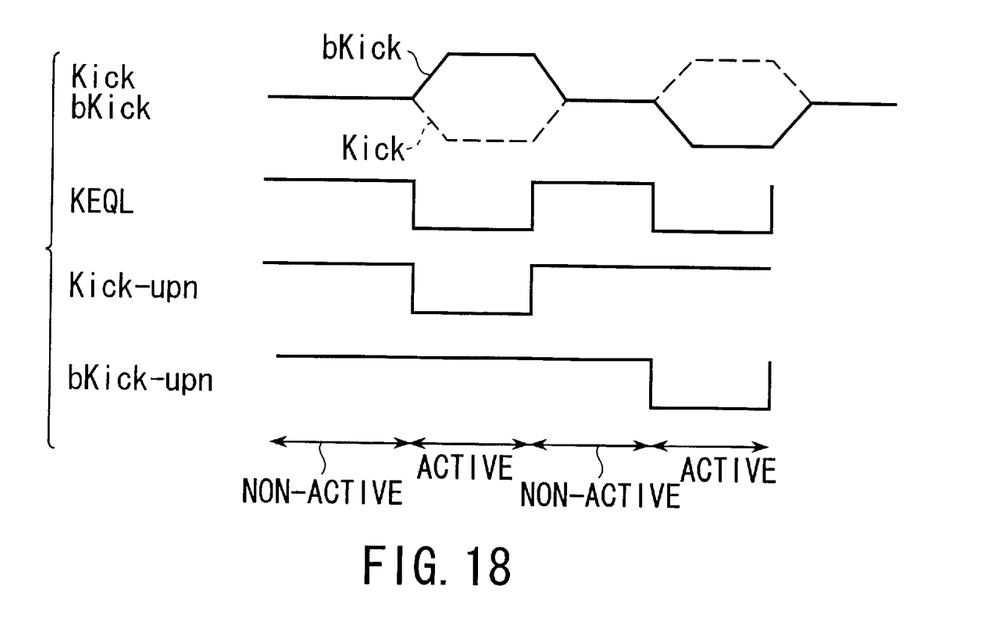
FIG. 18 is a waveform diagram showing one example of a signal which is different from that of FIG. 17 and is used in a DRAM according to this invention.

The method for attaining the lower current consumption in this invention can be applied to a case wherein the conventional dummy word line technique is used. One example of the operation of a DRAM according to a seventh embodiment of this invention in which this invention is applied to the dummy word line technique is shown in the waveform diagram of FIG. 16. When a memory cell connected to a bit line is accessed, a signal Kick is changed from Vpp/2 to Vss and a signal bKick is changed from Vpp/2 to Vpp. The circuit construction shown in FIGS. 1, 5 or 9 or the like can be used as it is. For example, in the case of FIG. 5, the input signals Kick, bKick can be controlled at timings shown in FIG. 17 and, for example, in the case of FIG. 9, the input signals Kick, bKick can be controlled at timings shown in FIG. 18.

As described above, according to this invention, a semiconductor memory device having a BL kicker circuit which does not cause a significant increase in the consumption current can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   plural pairs of bit lines;
   a memory cell array having a plurality of memory cells connected to said bit lines of plural pairs;
   a plurality of first capacitors each having one end and the other end, the one end being connected to one of the bit lines of a corresponding pair among said plural pairs of bit lines and the other end being commonly connected to a first node;
   a plurality of second capacitors each having one end and the other end, the one end being connected to the other one of the bit lines of a corresponding pair among said plural pairs of bit lines and the other end being commonly connected to a second node;
   a first driver circuit having an output node connected to the first node, for driving said plurality of first capacitors;
   a second driver circuit having an output node connected to the second node, for driving said plurality of second capacitors; and
   an equalizing circuit connected between the first and second nodes, for equalizing potentials of the first and second nodes.

2. The semiconductor memory device according to claim 1, further comprising a precharge circuit connected to the first and second nodes, for precharging the first and second nodes to a predetermined potential which lies in a range of amplitudes of potentials of the first and second nodes obtained at the driving time by said first and second driver circuits.

3. The semiconductor memory device according to claim 2, wherein said predetermined potential is generated by lowering an external power-supply voltage.

4. The semiconductor memory device according to claim 2, wherein said predetermined potential is of an intermediate value between the potentials the first and second node have when the first and second driver circuits driven.

5. The semiconductor memory device according to claim 2, wherein said first and second driver circuits receive inputs to set a potential of the other end of one of said first and second capacitors which is connected at one end to the bit line among said plural pairs of bit lines to which a memory cell to be accessed at the active time is connected higher than the precharge potential by said precharge circuit and set a potential of the other end of the other one of said first and second capacitors which is connected at one end to the bit line which makes a pair with the above bit line lower than the precharge potential by said precharge circuit.

6. The semiconductor memory device according to claim 2, wherein said first and second driver circuits receive inputs to set a potential of the other end of one of said first and second capacitors which is connected at one end to the bit line among said plural pairs of bit lines to which a memory cell to be accessed at the active time is connected lower than the precharge potential by said precharge circuit and set a potential of the other end of the other one of said first and second capacitors which is connected at one end to the bit line which makes a pair with the above bit line higher than the precharge potential by said precharge circuit.

7. The semiconductor memory device according to claim 2, wherein each of said first and second capacitors includes an N-channel MOS transistor having a source, drain and gate, the source and drain being connected together and connected to said one end and the gate being connected to the other end, and said precharge circuit precharges the first and second nodes to a potential higher than intermediate potentials of potential amplitudes of the first and second nodes obtained at the driving time by said first and second driver circuits.

8. The semiconductor memory device according to claim 2, wherein each of said first and second capacitors includes an N-channel MOS transistor having a source, drain and gate, the source and drain being connected together and connected to the other end and the gate being connected to said one end, and said precharge circuit precharges the first and second nodes to a potential lower than intermediate potentials of potential amplitudes of the first and second nodes obtained at the driving time by said first and second driver circuits.

9. The semiconductor memory device according to claim 2, wherein each of said first and second capacitors includes a P-channel MOS transistor having a source, drain and gate, the source and drain being connected together and connected to said one end and the gate being connected to the other end, and said precharge circuit precharges the first and second nodes to a potential lower than intermediate potentials of potential amplitudes of the first and second nodes obtained at the driving time by said first and second driver circuits.

10. The semiconductor memory device according to claim 2, wherein each of said first and second capacitors includes a P-channel MOS transistor having a source, drain and gate, the source and drain being connected together and connected to the other end and the gate being connected to said one end, and said precharge circuit precharges the first and second nodes to a potential higher than intermediate potentials of potential amplitudes of the first and second nodes obtained at the driving time by said first and second driver circuits.

11. The semiconductor memory device according to claim 2, further comprising a first charge pump circuit for creating a potential on the high-level side of the potential amplitudes of the first and second nodes, said precharge circuit precharges the first and second nodes to a potential higher than intermediate potentials of potential amplitudes of the first and second nodes obtained at the driving time by said first and second driver circuits.

12. The semiconductor memory device according to claim 2, further comprising a second charge pump circuit for creating a potential on the low-level side of the potential amplitudes of the first and second nodes, said precharge circuit precharges the first and second nodes to a potential lower than intermediate potentials of potential amplitudes of the first and second nodes obtained at the driving time by said first and second driver circuits.

13. The semiconductor memory device according to claim 1, wherein said equalizing circuit includes a MOS transistor whose gate is supplied with a control signal.

14. The semiconductor memory device according to claim 1, wherein each of said first and second driver circuits is a driver circuit whose output state is set to one of a high-level state, low-level state and high-impedance state.

15. The semiconductor memory device according to claim 14, wherein said driver circuit is a clocked gate logic circuit.

16. The semiconductor memory device according to claim 14, wherein said driver circuit is a clocked inverter circuit.

17. The semiconductor memory device according to claim 14, wherein said first driver circuit includes a first MOS transistor of P channel having a current path between the source and drain and a gate to which a first signal is input and a second MOS transistor of N channel having a gate to which a second signal is input and a current path between the source and drain serially connected to the current path between the source and drain of said first MOS transistor, and said second driver circuit includes a third MOS transistor of P channel having a current path between the source and drain and a gate to which a third signal having a complementary level with respect to the second signal is input and a fourth MOS transistor of N channel having a gate to which a fourth signal having a complementary level with respect to the first signal is input and a current path between the source and drain serially connected to the current path between the source and drain of said third MOS transistor.

18. A semiconductor memory device comprising:

plural pairs of bit lines;

first and second memory cell arrays having a plurality of memory cells connected to said bit lines of plural pairs;

a plurality of first capacitors each having one end and the other end, the one end being connected to one of the bit lines of a corresponding pair among said plural pairs of bit lines in said first memory cell array and the other end being commonly connected to a first node;

a plurality of second capacitors each having one end and the other end, the one end being connected to the other one of the bit lines of a corresponding pair among said plural pairs of bit lines in said first memory cell array and the other end being commonly connected to a second node;

a first driver circuit having an output node connected to the first node, for driving said plurality of first capacitors;

a second driver circuit having an output node connected to the second node, for driving said plurality of second capacitors;

a plurality of third capacitors each having one end and the other end, the one end being connected to one of the bit lines of a corresponding pair among said plural pairs of bit lines in said second memory cell array and the other end being commonly connected to a third node;

a plurality of fourth capacitors each having one end and the other end, the one end being connected to the other one of the bit lines of a corresponding pair among said plural pairs of bit lines in said second memory cell array and the other end being commonly connected to a fourth node;

a third driver circuit having an output node connected to the third node, for driving said plurality of third capacitors;

a fourth driver circuit having an output node connected to the fourth node, for driving said plurality of fourth capacitors;

a first equalizing circuit connected between the first and fourth nodes, for equalizing potentials of the first and fourth nodes; and a second equalizing circuit connected between the second and third nodes, for equalizing potentials of the second and third nodes.

19. The semiconductor memory device according to claim 18, further comprising a first precharge circuit connected to the first and fourth nodes, for precharging the first and fourth nodes to a first predetermined potential which lies in a range of amplitudes of potentials of the first and fourth nodes obtained at the driving time by said first and fourth driver circuits; and a second precharge circuit connected to the second and third nodes, for precharging the second and third nodes to a second predetermined potential which lies in a range of amplitudes of potentials of the second and third nodes obtained at the driving time by said second and third driver circuits.

20. The semiconductor memory device according to claim 19, wherein said first and second predetermined potential is generated by lowering an external power-supply voltage respectively.

21. The semiconductor memory device according to claim 19, wherein said first predetermined potential is of an intermediate value between the potentials the first and fourth node have when the first and fourth driver circuits are driven, and said second intermediate value between the between the potentials the second and third node have when the second and third driver circuits are driven.

22. The semiconductor memory device according to claim 18, wherein each of said equalizing circuits includes a MOS transistor having a gate supplied with a control signal.

23. The semiconductor memory device according to claim 18, wherein each of said first to fourth driver circuits is a driver circuit whose output state is set to one of a high-level state, low-level state and high-impedance state.

24. The semiconductor memory device according to claim 23, wherein said driver circuit is a clocked inverter circuit.

25. The semiconductor memory device according to claim 18, wherein each of said first to fourth capacitors includes an N-channel MOS transistor having a source, drain and gate, the source and drain being connected together and connected to said one end and the gate being connected to the other end, said first precharge circuit precharges the first and fourth nodes to a potential higher than intermediate potentials of potential amplitudes of the first and fourth nodes obtained at the driving time by said first and fourth driver circuits, and said second precharge circuit precharges the second and third nodes to a potential higher than intermediate potentials of potential amplitudes of the second and third nodes obtained at the driving time by said second and third driver circuits.

26. The semiconductor memory device according to claim 18, wherein each of said first to fourth capacitors includes an N-channel MOS transistor having a source, drain and gate, the source and drain being connected together and connected to the other end and the gate being connected to said one end, said first precharge circuit precharges the first and fourth nodes to a potential lower than intermediate potentials of potential amplitudes of the first and fourth nodes obtained at the driving time by said first and fourth driver circuits, and said second precharge circuit precharges the second and third nodes to a potential lower than intermediate potentials of potential amplitudes of the second and third nodes obtained at the driving time by said second and third driver circuits.

27. The semiconductor memory device according to claim 18, wherein each of said first to fourth capacitors includes a P-channel MOS transistor having a source, drain and gate, the source and drain being connected together and connected to said one end and the gate being connected to the other end, said first precharge circuit precharges the first and fourth nodes to a potential lower than intermediate potentials of potential amplitudes of the first and fourth nodes obtained at the driving time by said first and fourth driver circuits, and said second precharge circuit precharges the second and third nodes to a potential lower than intermediate potentials of potential amplitudes of the second and third nodes obtained at the driving time by said second and third driver circuits.

28. The semiconductor memory device according to claim 18, wherein each of said first to fourth capacitors includes a P-channel MOS transistor having a source, drain and gate, the source and drain being connected together and connected to the other end and the gate being connected to said one end, said first precharge circuit precharges the first and fourth nodes to a potential higher than intermediate potentials of potential amplitudes of the first and fourth nodes obtained at the driving time by said first and fourth driver circuits, and said second precharge circuit precharges the second and third nodes to a potential higher than intermediate potentials of potential amplitudes of the second and third nodes obtained at the driving time by said second and third driver circuits.

29. The semiconductor memory device according to claim 18, further comprising a first charge pump circuit for creating a potential on the high-level side of the potential amplitudes of the first to fourth nodes, said first precharge circuit precharges the first and fourth nodes to a potential higher than intermediate potentials of potential amplitudes of the first and fourth nodes obtained at the driving time by said first and fourth driver circuits, and said second precharge circuit precharges the second and third nodes to a potential higher than intermediate potentials of potential amplitudes of the second and third nodes obtained at the driving time by said second and third driver circuits.

30. The semiconductor memory device according to claim 18, further comprising a second charge pump circuit for creating a potential on the low-level side of the potential amplitudes of the first to fourth nodes, said first precharge circuit precharges the first and fourth nodes to a potential lower than intermediate potentials of potential amplitudes of the first and fourth nodes obtained at the driving time by said first and fourth driver circuits, and said second precharge circuit precharges the second and third nodes to a potential lower than intermediate potentials of potential amplitudes of the second and third nodes obtained at the driving time by said second and third driver circuits.

* * * * *